(12) United States Patent
Park

(10) Patent No.: US 9,224,926 B2
(45) Date of Patent: Dec. 29, 2015

(54) LIGHT-EMITTING DEVICE AND LIGHTING SYSTEM

(71) Applicant: LG INNOTEK CO., LTD., Seoul (KR)

(72) Inventor: Kyungwook Park, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 14/305,756

(22) Filed: Jun. 16, 2014

(65) Prior Publication Data

US 2014/0339588 A1    Nov. 20, 2014

Related U.S. Application Data

(63) Continuation of application No. 13/101,701, filed on May 5, 2011, now Pat. No. 8,779,450.

(30) Foreign Application Priority Data

May 20, 2010    (KR) .................. 10-2010-0047587

(51) Int. Cl.
*H01L 33/00* (2010.01)
*H01L 33/50* (2010.01)
(Continued)

(52) U.S. Cl.
CPC ............... *H01L 33/50* (2013.01); *H01L 33/46* (2013.01); *H01L 33/08* (2013.01); *H01L 2224/48091* (2013.01); *H01L 2224/48247* (2013.01)

(58) Field of Classification Search
CPC ....... H01L 33/50; H01L 33/145; H01L 33/60; H01L 33/405; H01L 33/502; H01L 33/504; H01L 51/5237; H01L 51/5271; H01L 2224/48091; H01L 2224/48247

USPC ....................................................... 257/98, 79
See application file for complete search history.

(56) References Cited

U.S. PATENT DOCUMENTS

| 6,373,188 B1 | 4/2002 | Johnson et al. ............. 313/506 |
| 6,841,802 B2 * | 1/2005 | Yoo ................................ 257/98 |
| 2002/0074558 A1 | 6/2002 | Hata et al. ..................... 257/89 |

(Continued)

FOREIGN PATENT DOCUMENTS

| CN | 101231931 | 7/2008 |
| CN | 101378103 | 3/2009 |

(Continued)

OTHER PUBLICATIONS

Chinese Office Action issued in related Application No. 201110136495.7 dated Apr. 28, 2013.

(Continued)

*Primary Examiner* — Thien F Tran
(74) *Attorney, Agent, or Firm* — Ked & Associates, LLP

(57) ABSTRACT

Disclosed is a light-emitting device including a support member, a reflective layer on the support member, a light-transmitting electrode layer on the reflective layer, a light-emitting structure on the light-transmitting electrode layer, the light-emitting structure being provided with a first conductive semiconductor layer, an active layer and a second conductive semiconductor layer, and a luminescence layer interposed between the reflective layer and the light-transmitting electrode layer. Accordingly, the luminescence layer is formed in the chip formation process to minimize non-uniform application of a phosphor composed of an epoxy resin and simplify fabrication of the light-emitting device.

16 Claims, 19 Drawing Sheets

(51) Int. Cl.
*H01L 33/46* (2010.01)
*H01L 33/08* (2010.01)

(56) References Cited

U.S. PATENT DOCUMENTS

| | | |
|---|---|---|
| 2006/0065901 A1 | 3/2006 | Aoyagi et al. .................. 257/79 |
| 2007/0228935 A1 | 10/2007 | Kim et al. |
| 2008/0210967 A1 | 9/2008 | Shen |
| 2008/0315228 A1 | 12/2008 | Krames et al. .................. 257/98 |

FOREIGN PATENT DOCUMENTS

| | | |
|---|---|---|
| CN | 201532968 | 7/2010 |
| DE | 10 2004 052 245 A1 | 2/2006 |
| DE | 10 2007 003 785 A1 | 7/2008 |
| DE | 10 2008 012 407 A1 | 8/2009 |
| EP | 1 111 689 A2 | 6/2001 |
| KR | 10-2009-0080217 A | 7/2009 |

OTHER PUBLICATIONS

Chinese Office Action issued in related Application No. 201110136495.7 dated Dec. 25, 2013.
U.S. Office Action issued in related U.S. Appl. No. 13/101,701 on Jul. 15, 2013.
U.S. Notice of Allowance issued in related U.S. Appl. No. 13/101,701 on Mar. 7, 2014.
Korean Office Action issued in Application No. 10-2010-0047587 dated Aug. 11, 2015.
European Search Report issued in Application No. 11166278.9 dated Oct. 27, 2015.

* cited by examiner

LIGHT-EMITTING DEVICE AND LIGHTING SYSTEM

CROSS-REFERENCE TO RELATED APPLICATION

This application is a continuation of U.S. patent application Ser. No. 13/101,701, filed on May 5, 2011, which claims the priority benefit of Korean Patent Application No. 10-2010-0047587, filed on May 20, 2010 in the Korean Intellectual Property Office, the disclosures of which are incorporated herein by reference.

BACKGROUND OF THE INVENTION

1. Field of the Invention

The present embodiment relates to a light-emitting device and a lighting system.

2. Description of the Related Art

Generally, nitride light-emitting devices have a light-emitting region including ultraviolet, blue and green light. GaN nitride light-emitting devices are generally formed by forming a buffer layer on a sapphire substrate and then forming an active layer with a multi-quantum well structure on the buffer layer. A nitride light-emitting device is subjected to processes to produce blue or green light and is then mounted in the form of light-emitting chips on a package. Then, a phosphor is applied to the package in order to form white light, to fabricate a white light-emitting device. However, in the package fabrication process, the phosphor applied onto the light-emitting chip has non-uniformity and is applied to the package in the form of a mixture with transparent silicon, thus being disadvantageously vulnerable to heat generated by the light-emitting chip.

SUMMARY OF THE INVENTION

Therefore, the present embodiments have been made in view of the above problems, and it is to provide a light-emitting device to realize a luminescence layer in the process of fabricating light-emitting chips.

In accordance with one aspect of the present embodiments, the above and other embodiments can be accomplished by the provision of a light-emitting device comprising a reflective layer; a light-emitting structure on the reflective layer, the light-emitting structure including a first conductive semiconductor layer, an active layer and a second conductive semiconductor layer and a luminescence layer interposed between the reflective layer and the light-transmitting electrode layer.

In one embodiment, the light-emitting device may include a luminescence layer including at least one of yellow phosphors, YAG, TAG, sulfide, silicate, aluminate, nitride, carbide, nitridosililcate, borate, fluoride and phosphate phosphors, and R, G and B tri-color phosphors.

In one embodiment, the light-emitting device may include a luminescence layer having a thickness of 0.5 µm to 4 µm.

In one embodiment, the light-emitting device may include a luminescence layer having a thickness of 1 µm to 2 µm.

In one embodiment, the light-emitting device may include a reflective layer having at least one of metal and metal oxide.

In one embodiment, the light-emitting device may include a luminescence layer including a pattern structure.

In one embodiment, the pattern structure including pattern units spaced from one another by a predetermined distance of 0.1 µm to 1 µm.

In one embodiment, the pattern structure including a plurality of holes, wherein the reflective layer may be connected to the light-transmitting electrode layer through the holes.

In another embodiment, the light-emitting device may include a luminescence layer including at least two layers.

In another embodiment, the light-emitting device may include a luminescence layer including a first layer including an R phosphor, a second layer including a G phosphor, and a third layer including a B phosphor.

In another embodiment, the light-emitting device may include a reflective layer having a roughness structure.

In another embodiment, the light-emitting device may include a reflective layer including at least two layers.

In another embodiment, the light-emitting device may include a reflective layer including a first layer having a first index of refraction and a second layer having a second index of refraction, wherein the second index of refraction may be different from the first index of refraction.

In another embodiment, the first layer and the second layer may be repeatedly laminated.

In another embodiment, the light-emitting device may include a current blocking layer, wherein the current blocking layer may be interposed between the light-transmitting electrode layer and the light-emitting structure.

In another embodiment, the current blocking layer comprises at least one of silicon dioxide ($SiO_2$) or aluminum oxide ($Al_2O_3$).

In another embodiment, the light-emitting device may include a reflective layer, a support member on the reflective layer; a light-emitting structure on the support member, the light-emitting structure provided with a first conductive semiconductor layer, an active layer and a second conductive semiconductor layer; and a luminescence layer interposed between the reflective layer and the light-transmitting electrode layer.

In another embodiment, the support member may surround the luminescence layer.

In another embodiment, the support member may surround the luminescence layer and the reflective layer.

BRIEF DESCRIPTION OF THE DRAWINGS

The present embodiments will be more clearly understood from the following detailed description taken in conjunction with the accompanying drawings, in which.

DETAILED DESCRIPTION OF THE PREFERRED EMBODIMENTS

Figure 1:
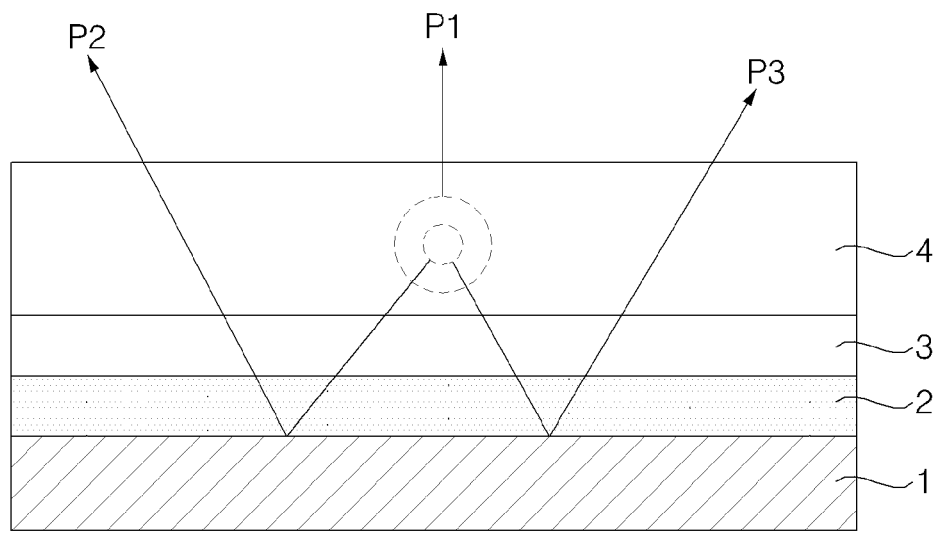
FIG. 1 is a conceptual view illustrating a light-emitting device according to one embodiment.

Reference will now be made in detail to the embodiments of the present invention, examples of which are illustrated in the accompanying drawings. Wherever possible, the same reference numbers will be used throughout the drawings to refer to the same or like parts.

Prior to description of the embodiments, it will be understood that, when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" of each layer will be described based on illustration in the drawings.

In the drawings, the thicknesses or sizes of respective layers are exaggerated, omitted or schematically illustrated for clarity and convenience of description. Therefore, the sizes of respective elements do not wholly reflect actual sizes thereof.

Hereinafter, the present embodiment will be described with reference to the annexed drawings in more detail.

FIG. 1 is a concept view illustrating a light-emitting device according to one embodiment.

Referring to FIG. 1, the light-emitting device 10 according to the present embodiments include a support member 1, a reflective layer 2 arranged on the support member 1, a luminescence layer 3 arranged on the reflective layer 2 and a light-emitting structure 4 arranged on the luminescence layer 3.

Among light emitted from the light-emitting structure 4, direct light travelling in a direction P1 to directly discharge to the outside, but indirect light travelling in directions P2 and P3 passes through the luminescence layer 3 and is thus excited by a phosphor present in the luminescence layer 3, when it is reflected by the reflective layer 2 and directs to the outside or to the reflective layer 2.

Accordingly, the light-emitting device does not require an additional phosphor, other than the phosphor present in the luminescence layer 3 and an additional luminescence layer is not formed in the light-emitting device package process, thus solving the problems of the package process. For example, the problem in which a sealant is deteriorated due to a phosphor formed in the sealant surrounding the light-emitting device 10 can be solved Meanwhile, a ratio of light directly emitted from the light-emitting structure 4 to the outside in a direction (P1) and light travelling toward the reflective layer 2 in directions (P2, P3) is about 1:2.

In this embodiment, the ratio of P1:(P2+P3) is 1:2. However, this ratio is a variable which may increase or decrease, depending on the structure of the light-emitting structure 4 and it is apparent that the ratio is not limited thereto.

Meanwhile, as mentioned below, this embodiment may be applied to all of vertical light-emitting devices, horizontal light-emitting devices and flip chips, without being limited thereto.

Figure 2:
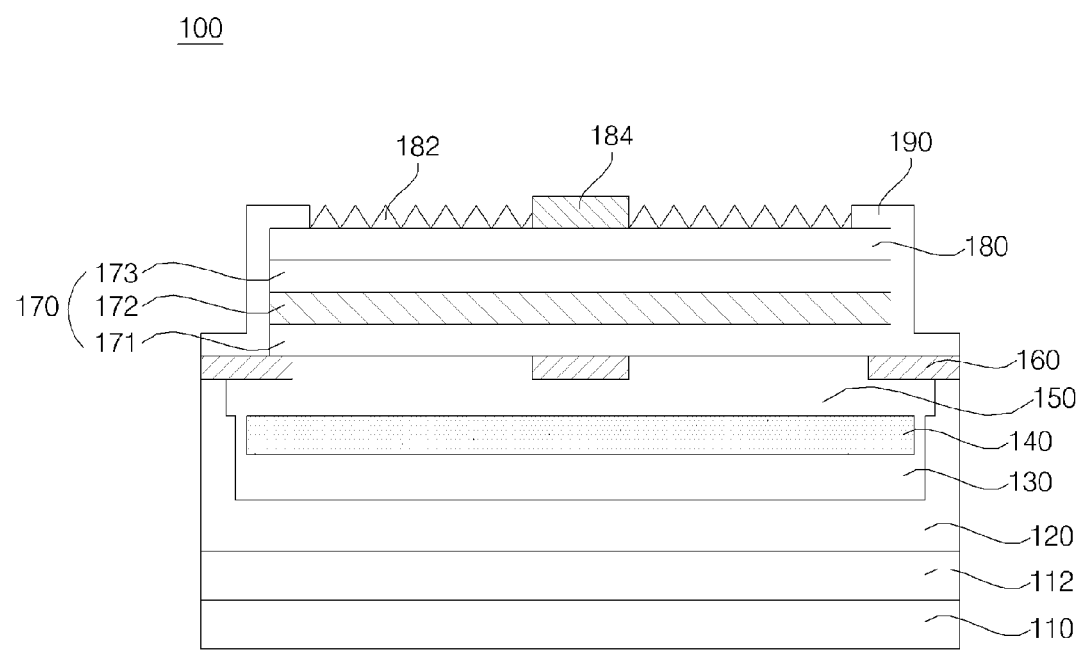
FIG. 2 is a sectional view illustrating a light-emitting device according to one embodiment.

FIG. 2 is a sectional view illustrating a light-emitting device according to a first embodiment.

Referring to FIG. 2, the light-emitting device 100 according to the first embodiment includes a support member 110, a reflective layer arranged on the support member 110, a luminescence layer 140 arranged on the reflective layer 130, a first light-transmitting electrode layer 106 arranged on the luminescence layer 140, and a light-emitting structure 170 arranged on the first light-transmitting electrode layer 150.

The support member 110 may be made of a thermally conductive material and may be a conductive support substrate composed of a conductive material such as a metal or conductive ceramic. The support member 110 may be a mono-layer, or a di- or multi-layer including a metal layer (not shown) and an insulating layer (not shown).

That is, the support member 110 may be made of a metal selected from Au, Ni, W, Mo, Cu, Al, Ta, Ag, Pt and Cr, or an alloy thereof. In addition, the support member 110 may be realized as a carrier wafer such as Si, Ge, GaAs, ZnO, SiC, SiGe, GaN or $Ga_2O_3$.

Such a support member 110 facilitates discharge of light emitted from the light-emitting device 100 and thus improves thermal stability of the light-emitting device 100.

An adhesive layer 112 may be laminated on the support member 110 and is made of a metal which exhibits superior adhesivity to a material arranged thereunder.

The adhesive layer 112 includes, but is not limited to a barrier metal or a bonding metal and, for example, includes at least one of titanium (Ti), gold (Au), tin (Sn), nickel (Ni), chrome (Cr), gallium (Ga), indium (In), bismuth (Bi), copper (Cu), silver (Ag) and tantalum (Ta). The adhesive layer 112 may be formed by joining different adhesive layers (not shown), without being limited thereto.

Meanwhile, the adhesive layer 112 may further include a diffusion barrier layer 120. Accordingly, the adhesive layer 112 and the diffusion barrier layer 120 may be integrated in a mono-layer, or the diffusion barrier layer 120 is arranged on or under the adhesive layer 112 such that these layers are separated from each other. The configuration and lamination order of the adhesive layer 112 and the diffusion barrier layer 120 are not limited.

Meanwhile, at least one of the adhesive layer 112 and the diffusion barrier layer 120 is formed on the support member 110, although the present invention is not limited thereto.

A reflective layer 130 may be arranged on the diffusion barrier layer 120.

The reflective layer 130 may be interposed between the support member 110 and the luminescence layer 140 and is composed of a highly reflective material selected from Ag, Ni, Al, Rh, Pd, Ir, Ru, Mg, Zn, Pt, Au, Hf and a combination thereof, may be a multi-layer formed using the metal material and a light-transmitting material such as IZO, IZTO, IAZO, IGZO, IGTO, AZO and ATO. Meanwhile, the reflective layer 130 may be a distributed Bragg reflector (DBR) formed by laminating a plurality of layers with different indexes of refraction and is not limited thereto. In addition, the reflective layer 130 may be a laminate of IZO/Ni, AZO/Ag, IZO/Ag/Ni, AZO/Ag/Ni or the like. Meanwhile, the reflective layer 130 may include any structure such as a roughness structure or a patterned structure and have a photonic crystal structure, without being limited thereto.

A luminescence layer 140 may be arranged on the reflective layer 130.

A phosphor may be present in the luminescence layer 140 and may be at least one of blue light-emitting phosphors, bluish green light-emitting phosphors, green light-emitting phosphors, yellowish green light-emitting phosphors, yellow light-emitting phosphors, yellowish red light-emitting phosphors, orange light-emitting phosphors, and red light-emitting phosphors, without being limited thereto.

That is, a phosphor is excited by a first light emitted from the light-emitting device 100 to produce second light. For example, in the case where the light-emitting device 100 is a blue light-emitting diode and the phosphor is a yellow phosphor, the yellow phosphor is excited by blue light to emit yellow light, blue light emitted from the blue light-emitting diode is mixed with yellow light excited by blue light to allow the light-emitting device 100 to render white light.

Similarly, in the case where the light-emitting device 100 is a green light-emitting diode, the magenta phosphor or a combination of blue and red phosphors may be exemplified, and in the case where the light-emitting device 100 is a red light-emitting diode, a cyan phosphor or a combination of blue and green phosphors may be exemplified.

Such a phosphor may be a known phosphor such as YAG, TAG, sulfides, silicates, aluminates, nitrides, carbides, nitridosililcates, borates, fluorides and phosphates.

Preferably, in the case where the light-emitting structure 170 emits ultraviolet light, the luminescence layer 140 may include all of R, G and B phosphors. R, G and B phosphors may be a single luminescence layer 140 formed by separately laminating an R luminescence layer, a G luminescence layer and a B luminescence layer, or the R, G and B phosphors may be distributed in a single luminescence layer 140.

The luminescence layer 140 may be formed by thinly coating these phosphors, followed by sputtering, or nano-ink printing, without being limited thereto. In addition, a luminescence layer 140 may be formed by forming a layer composed of an epoxy, silicone or other resin material, dispersing a phosphor thereon and curing the same through heat or ultraviolet irradiation, without being limited thereto.

The luminescence layer 140 enables light emitted from the light-emitting structure 170 to render white-like color. However, light which directly emitted from the light-emitting structure 170 to the outside may be blue, and the light-emitting device 100 according to this embodiment outputs bluish white light, which has slightly higher color temperature than conventional white light.

Meanwhile, a ratio of light which is directly emitted from the light-emitting structure 170 to the outside in a direction (P1) and light which travels toward the reflective layer 2 in directions (P2, P3) is about 1:2. Accordingly, light emitted from the light-emitting device 100 according to the present embodiment may be white-like color. The color temperature of the white light may be changed, depending on the ratio of blue light, and the light-emitting device 100 according to this embodiment outputs bluish white light, that is, white light having a high color temperature.

In addition, as mentioned above, the ratio of P1:(P2+P3) is defined as 1:2. However, this ratio is a variable which may increase or decrease, depending on the structure of the light-emitting structure 170 and it is apparent that the ratio is not limited thereto.

The luminescence layer 140 excites first color light generated from the light-emitting structure 170 to produce second color light. When the luminescence layer 140 is excessively thin, optical properties thereof may be deteriorated, and when the luminescence layer 140 is excessively thick, brightness may be reduced. Accordingly, the luminescence layer 140 may have a thickness range of 0.5 µm to 4 µm and preferably, of 1 µm to 2 µm.

The light-transmitting electrode layer 150 may be arranged on the luminescence layer 140.

The light-transmitting electrode layer 150 may be composed of at least one selected from ITO, IZO(In—ZnO), GZO(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au and Ni/$IrO_x$/Au/ITO, and is partially or entirely formed on the bottom of the light-emitting structure 170 to prevent current crowding.

A current blocking layer (CBL, 160) may be arranged between the light-transmitting electrode layer 150 and the light-emitting structure 170. The current blocking layer 160 prevents current crowding in which current is concentrated on the bottom of the electrode 184. The current blocking layer 160 may be composed of silicon dioxide ($SiO_2$) or aluminum oxide ($Al_2O_3$) containing silicon dioxide ($SiO_2$).

The light-emitting structure 170 provided with a first conductive semiconductor layer 171, an active layer 172 and a second conductive semiconductor layer 173 may be formed on the light-transmitting electrode layer 150.

The first conductive semiconductor layer 171 may be formed on the light-transmitting electrode layer 150. The first conductive semiconductor layer 171 may be realized with a p-type semiconductor layer doped with a p-type dopant. The p-type semiconductor layer may be selected from semiconductor materials such as GaN, AlN, AlGaN, InGaN, InN, InAlGaN and AlInN having the formula of $In_xAl_yGa_{1-x-y}N$ ($0 \leq x \leq 1$, $0 \leq y \leq 1$, $0 \leq x+y \leq 1$) and may be doped with a p-type dopant such as Mg, Zn, Ca, Sr and Ba.

The active layer 172 is arranged on the first semiconductor layer 171. The active layer 172 may be formed with a mono or multi-quantum well structure, a quantum wire structure, a quantum dot structure or the like using a compound semiconductor material composed of Group III-V elements.

In the case where the active layer 172 has a quantum well structure, for example, it may have a mono- or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq a \leq 1$, $0 \leq b \leq 1$, $0 \leq a+b \leq 1$). The well layer may be formed of a material having a smaller band gap than that of the barrier layer.

A conductive clad layer (not shown) may be arranged on and/or under the active layer 172. The conductive clad layer (not shown) may be composed of an AlGaN-based semiconductor, and may have a higher band gap than the active layer 172.

The second conductive semiconductor layer 173 may be formed on the active layer 172. The second conductive semiconductor layer 173 may be realized with an n-type semiconductor layer, and for example, the n-type semiconductor layer may be selected from semiconductor materials having the formula of $In_xAl_yGa_{1-x-y}N$ ($0 \leq x \leq 1$, $0 \leq y \leq 1$, $0 \leq x+y \leq 1$) such as GaN, AlN, AlGaN, InGaN, InN, InAlGaN and AlInN, and may be doped with an n-type dopant such as Si, Ge, Sn, Se and Te.

The first semiconductor layer 171, the active layer 172 and the second semiconductor layer 173 may be formed by a method such as metal organic chemical vapor deposition (MOCVD), chemical vapor deposition (CVD), plasma-enhanced chemical vapor deposition (PECVD), molecular beam epitaxy (MBE) and hydride vapor phase epitaxy (HVPE), without being limited thereto.

In addition, the concentration of conductive dopant doped in the first semiconductor layer 171 and the second semiconductor layer 173 may be uniform or non-uniform. That is, the structure of a plurality of semiconductor layers may be varied and is not limited.

Meanwhile, the light-emitting structure 170 may include a third semiconductor layer (not shown) with a polarity opposite that of the first semiconductor layer 171, arranged under the first semiconductor layer 171. In addition, the first semiconductor layer 171 may be realized with a p-type semiconductor layer and the second semiconductor layer 173 may be realized with an n-type semiconductor layer. Accordingly, the light-emitting structure layer 170 may include at least one of N-P junction, P-N junction, N-P-N junction and P-N-P junction structures, without being limited thereto.

The second light-transmitting electrode layer 180 may be formed on the second conductive semiconductor layer 173.

The second light-transmitting electrode layer 180 may be composed of the same material as the first light-transmitting electrode layer 150 and is not limited thereto.

An electrode 184 and a light extraction structure 182 are formed on the second light-transmitting electrode layer 150.

The electrode 184 may be formed in a mono- or multi-layer using a conductive material, for example, a metal selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof.

The light extraction structure 182 may be formed on the second light-transmitting electrode layer 180 to uniformly disperse light from the active layer 172 to the outside. The light extraction structure 182 may take the shape of a regular prism or an irregular pattern or may take the shape of a convex or concave lens, and may have another shape. The light extraction structure 182 may have a height of about 0.1 um to about 3 um and is irregular with a random size, without being limited thereto. The light extraction structure 182 may have an uneven upper surface which includes at least one selected from a textured pattern, a roughness pattern and an uneven pattern.

The side cross-section of the light extraction structure 182 may have various shapes, such as a cylinder, a polyprism, a cone, a polypyramid, a circular truncated cone and a frustum of a pyramid, and preferably has a conical or polypyramidal shape.

A passivation layer 190 may be formed on both sides of the light-emitting structure 170 to prevent damage of the light-emitting structure 170.

In FIG. 2, a part of light emitted from the light-emitting structure 170 is discharged to the outside and the remaining light passes through the first light-transmitting electrode layer 150 and travels towards the reflective layer 130. The ratio of light which is directly emitted from the light-emitting structure 170 to the outside in a direction (P1) and light which travels toward the reflective layer 130 in directions (P2, P3) is about 1:2 to 1:3. White light can be realized through the luminescence layer 140 arranged under the light-emitting structure 170 at this ratio.

Hereinafter, assuming that the light-emitting structure 170 emits blue light, the luminescence layer 140 will be described.

Indirect light emitted from the light-emitting structure 170 passes through the luminescence layer 140 and is excited by the phosphor arranged in the luminescence layer 140. Accordingly, blue indirect light is excited by the phosphor to produce white light. Meanwhile, when indirect light is reflected by the reflective layer 130 and travels toward the light-emitting structure 170, it passes through the luminescence layer 140. Clearly, the indirect light reflected by the reflective layer 130 is also excited by the phosphor in the luminescence layer 140 to produce white light.

The luminescence layer 140 and the reflective layer 130 are formed in the light-emitting device 100, light emitted from the light-emitting device 100 produces white light through the luminescence layer 140 and the reflective layer 130 present in the light-emitting device 100, thus eliminating the necessity of additional phosphor and causing no formation of the luminescence layer 140 in the light-emitting device package process and thereby solving problems involved in the package process. In addition, the necessity of forming the phosphor in a sealant formed in the light-emitting device package and surrounding the light-emitting device 100 is eliminated and problems associated with sealant deterioration can be solved.

Figure 3:
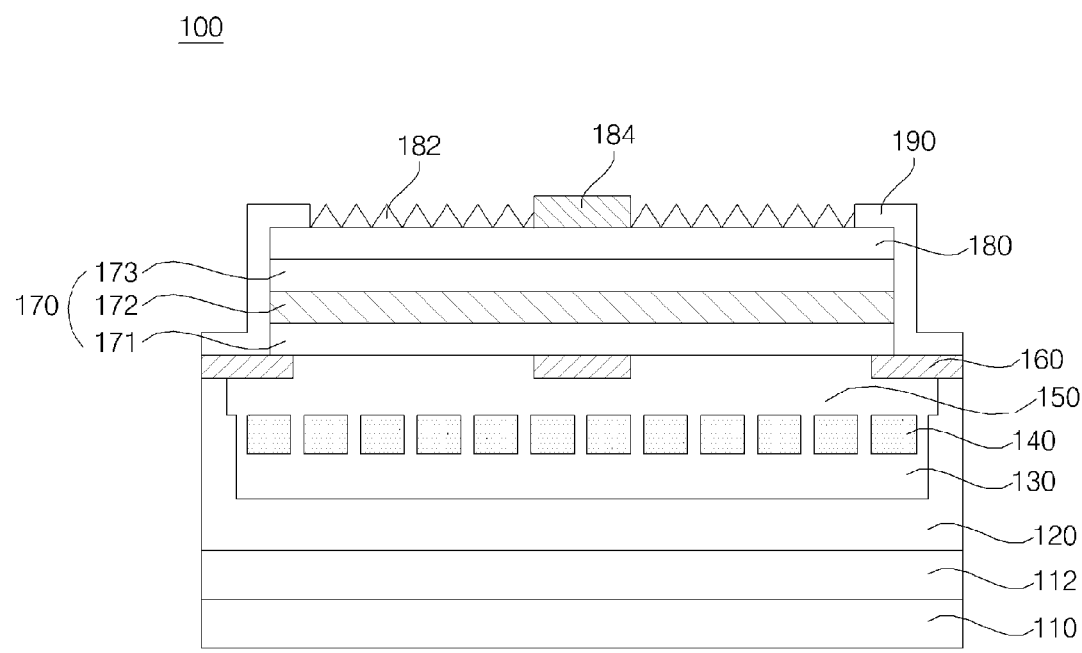
FIG. 3 is a sectional view illustrating the light-emitting device according to another embodiment.

FIG. 3 is a sectional view illustrating the light-emitting device according to a second embodiment.

Referring to FIG. 3, the light-emitting device 100 according to this embodiment may include a luminescence layer 140 including a pattern structure 142.

The luminescence layer 140 may include a pattern structure 142 which is patterned by a predetermined distance to provide a plurality of holes. The pattern structure 142 is provided with a plurality of holes which are spaced from one another by a predetermined or any distance, without being limited thereto.

The luminescence layer 140 includes the pattern structure 142, thus preventing isolation between the light-emitting structure 170 and the layer arranged therebelow. This increases current diffusion effects of the light-emitting structure 170.

In addition, the luminescence layer 140 includes the pattern structure 142, thus enabling indirect light which travels from the light-emitting structure 170 toward the reflective layer 130 to produce blue-like color.

This behavior is due to the fact that, when indirect light is reflected from the reflective layer 130 and passes to the outside, the percentage of the indirect light which passes through the luminescence layer 140 decreases. This means that the color temperature of light emitted from the light-emitting device 100 according to the second embodiment can be controlled depending on the width of the pattern formed on the luminescence layer 140. Blue light increases the color temperature while red light decreases the color temperature.

The pattern structure 142 may have a patterning distance of 0.1 μm to 1 μm, and the patterning distance may increase or decrease depending on the thickness of the luminescence layer 140 and ease of manufacture, without being limited thereto.

Figure 4:
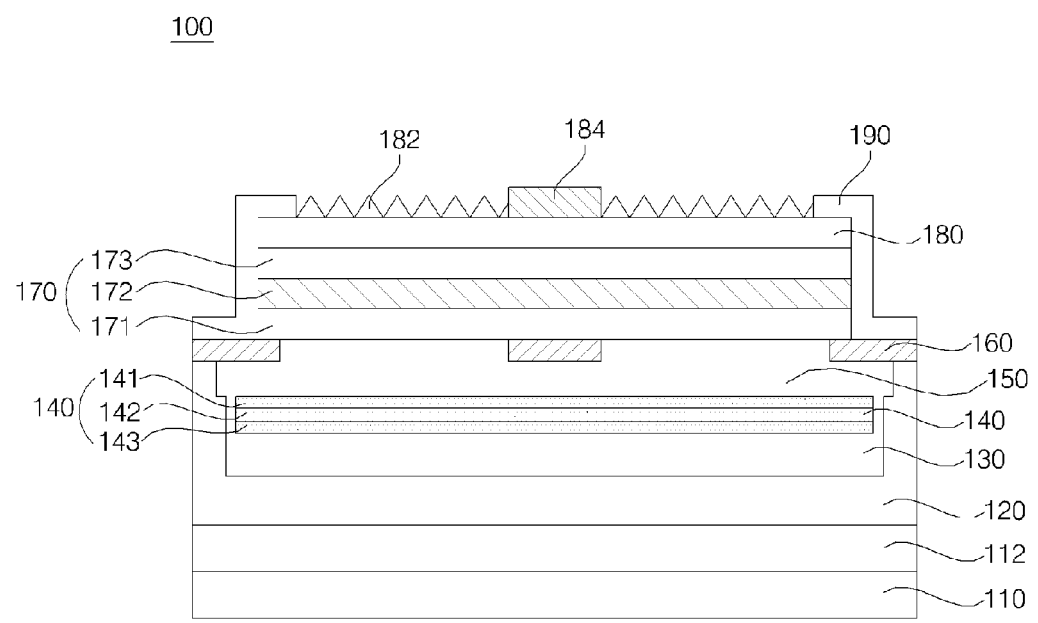
FIG. 4 is a sectional view illustrating the light-emitting device according to another embodiment.

FIG. 4 is a sectional view illustrating the light-emitting device according to a third embodiment.

Referring to FIG. 4, the light-emitting device 100 according to the present embodiment may include a luminescence layer 140 including a plurality of layers.

The luminescence layer 140 may include at least two layers, without being limited thereto. Preferably, respective layers may include at least one type of phosphor. For example, the first layer 141 includes an R phosphor, the second layer 142 includes a G phosphor, and the third layer 143 includes a B phosphor, without being limited thereto.

The luminescence layer 140 includes a plurality of layers and the respective layers include at least one type of phosphor, thus enabling the phosphor present in the luminescence layer 140 to be uniformly distributed and improving light distribution of the light-emitting device 100.

Meanwhile, the first layer 141, the second layer 142 and the third layer 143 have different indexes of refraction.

The first layer 141, the second layer 142 and the third layer 143 have different indexes of refraction, thus preventing total internal reflection, which may occur when indirect light emitted from the light-emitting structure 170 passes through the respective layers, and thus improving light extraction efficiency of the light-emitting device 100.

Meanwhile, the first layer 141, the second layer 142 and the third layer 143 may include roughness (not shown). The roughness (not shown) may be formed on at least one of the first layer 141, the second layer 142 and the third layer 143 and is not limited thereto. In addition, the cross-section of the roughness (not shown) may have various shapes, such as a cylinder, a polyprism, a cone, a polypyramid, a circular truncated cone, a frustum of a pyramid and a sphere, and is not limited thereto.

The first layer 141, the second layer 142 and the third layer 143 include a roughness (not shown), thus preventing total internal reflection which may occur when indirect light emitted from the light-emitting structure 170 passes though the respective layers, and thereby improving light extraction efficiency of the light-emitting device 100.

Figure 5A:
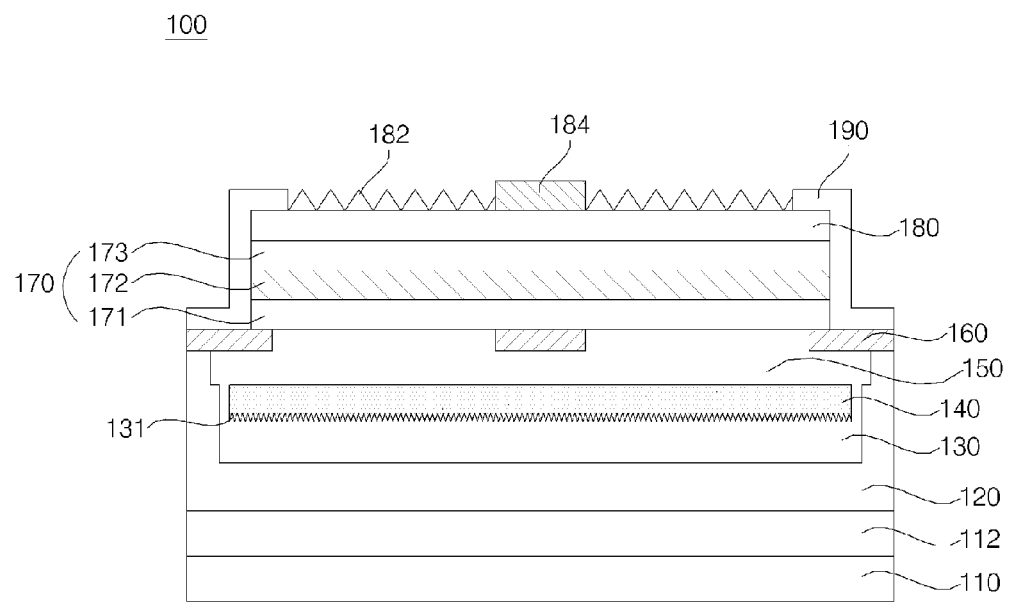
FIG. 5A is a sectional view illustrating the light-emitting device according to another embodiment.
Figure 5B:
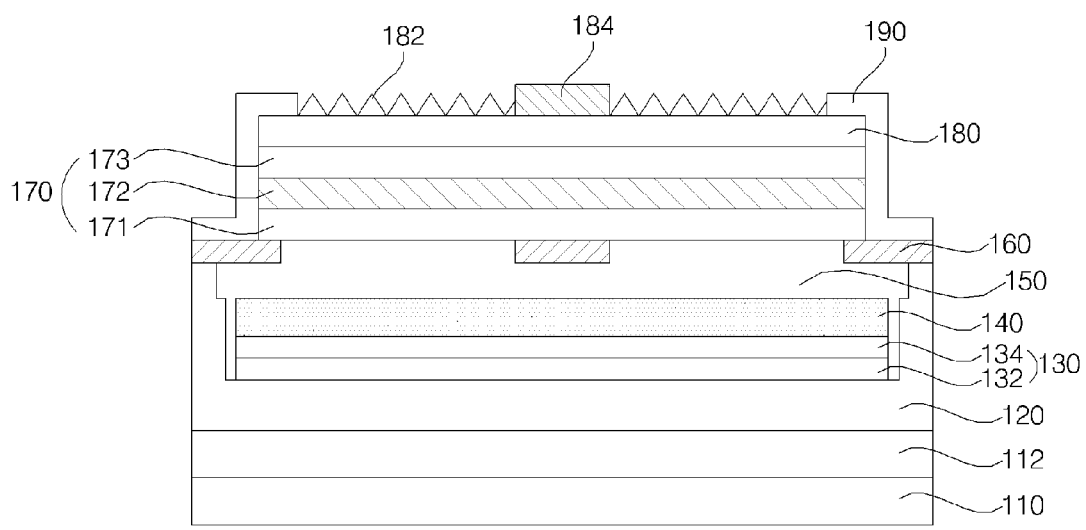
FIG. 5B is a sectional view illustrating the light-emitting device according to another embodiment.

FIGS. 5A and 5B are sectional views illustrating the light-emitting device according to a fourth embodiment.

Referring to FIG. 5A, the reflective layer 130 may include a roughness structure 131.

The roughness structure 131 may be a regular or irregular pattern, may take the shape of a convex or concave lens, or may have another shape.

The side cross-section of the roughness structure 131 may have various shapes, such as a cylinder, a polyprism, a cone, a polypyramid, a circular truncated cone and a frustum of a pyramid, without being limited thereto.

Meanwhile, referring to FIG. 5B, the reflective layer 130 may be a distributed Bragg reflector (DBR) layer including a plurality of layers with different indexes of refraction.

The reflective layer 161 may include a first layer 132 having a first index of refraction and a second layer 134 having a second index of refraction different from the first refraction index. The first and second layers 132 and 134 are described in FIG. 5B, but are not limited thereto. The reflective layer 130 may include a plurality of layers (not shown) having different indexes of refraction.

That is, the reflective layer 130 has a structure in which the layers 132 and 134 with different indexes of refraction are repeatedly alternately laminated. In an example, the first layer 132 may have a low index of refraction and the second layer 134 may have a high index of refraction, but the present invention is not limited thereto.

Meanwhile, assuming that $\lambda$ is a wavelength of light generated from the active layer 172, n is an index of refraction of a medium and m is an odd number, the reflective layer 130 may have a laminate structure which may be obtained by repeatedly alternately laminating a first layer 132 having a thickness of $m\lambda/4n$ and a low index of refraction and a second layer 134 having a high index of refraction to obtain a light reflectivity of 95% or higher in a specific wavelength region ($\lambda$).

Accordingly, the first layer 132 having a low index of refraction and the second layer 134 having a high index of refraction may have a thickness of $\lambda/4$ of reference wavelength and the layers 132 and 134 may have a thickness of 2 Å to 10 um.

In addition, the layers 132 and 134 constituting the reflective layer 130 may include $Al_2O_3$, $SiO_2$, $TiO_2$, $TiN_x$, $InO_x$, $SiN_x$ or $Ta_xO_y$ (x, y: constant), or include $M_xO_y$ (M: metal, O: oxide, x, y: constant), but the present invention is not limited thereto.

In an example, the first layer 132 having a low index of refraction may utilize $SiO_2$ having an index of refraction of 1.4 or $Al_2O_3$ having an index of refraction of 1.6, the second layer 134 having a high index of refraction may utilize $TiO_2$ having an index of refraction of 2 or higher, but the present invention is not limited thereto.

Meanwhile, the index of refraction of the medium between the first layer 132 having a low index of refraction and the second layer 134 having a high index of refraction is increased in order to improve reflectivity, without being limited thereto.

Since the reflective layer 130 has a larger band gap than that of oscillating wavelength, it does not absorb light and may realize high light reflectivity.

Figure 6A:
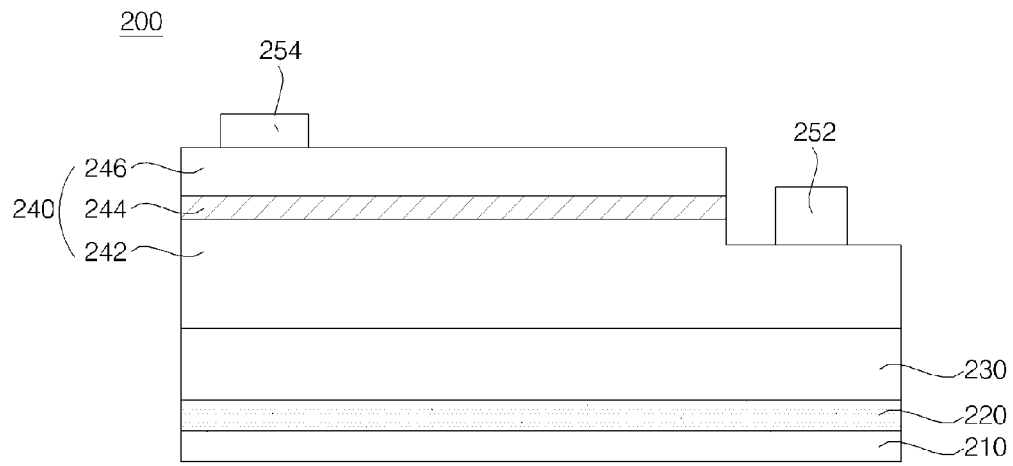
FIG. 6A is a sectional view illustrating the light-emitting device according to another embodiment.
Figure 6B:
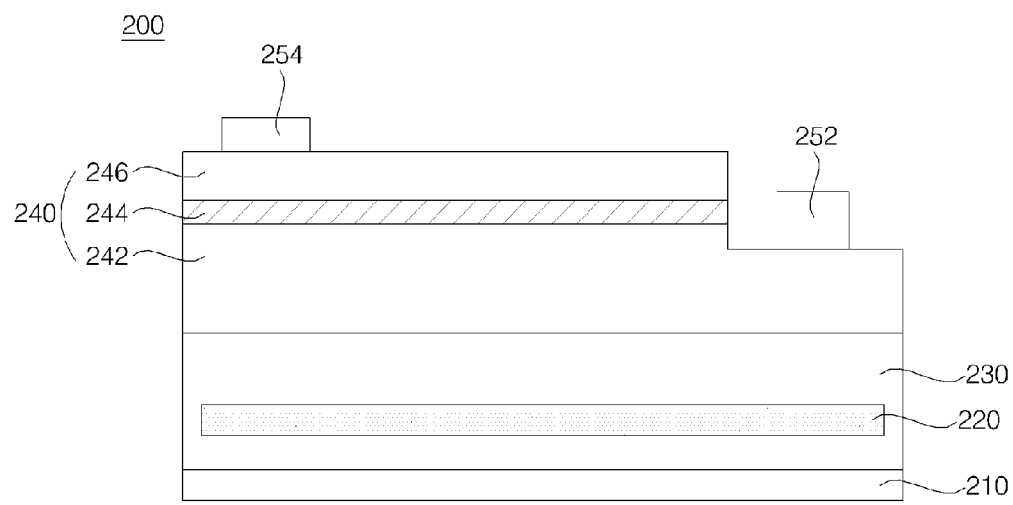
FIG. 6B is a sectional view illustrating the light-emitting device according to another embodiment.
Figure 6C:
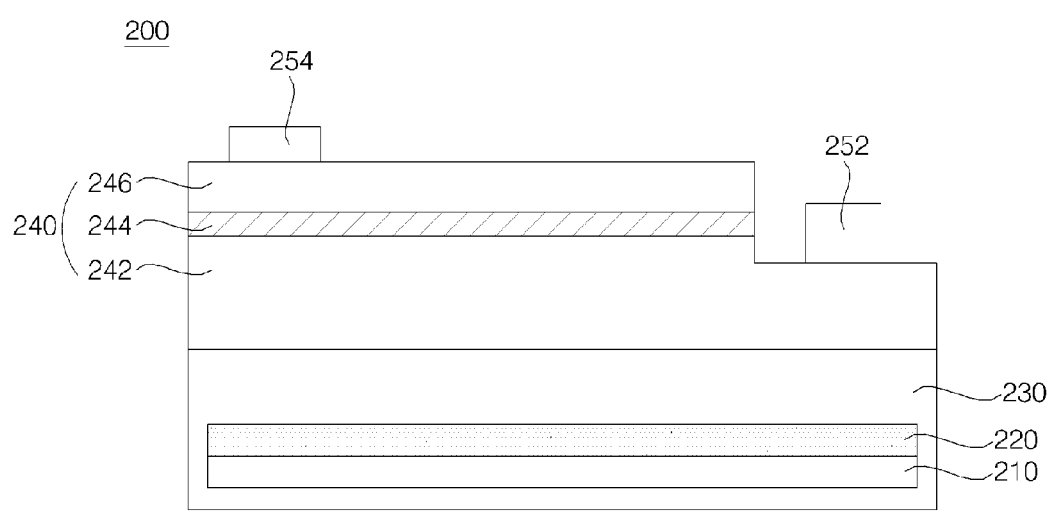
FIG. 6C is a sectional view illustrating the light-emitting device according to another embodiment.

FIGS. 6A to 6C are sectional views illustrating the light-emitting device according to a fifth embodiment.

Referring to FIGS. 6A to 6C, the light-emitting device 200 according to this embodiment may include a reflective layer 210, a luminescence layer 220 arranged on the reflective layer 210, a support member 230 arranged on the luminescence layer 220, and a light-emitting structure 240 arranged on the support member 230, the light-emitting structure 240 provided with a first conductive semiconductor layer 242, an active layer 244 and a second conductive semiconductor layer 246.

The reflective layer 210 and the luminescence layer 220 have been described above and a detailed explanation thereof is thus omitted.

The support member 230 is composed of a light transmitting material and may be a hetero-substrate such as sapphire ($Al_2O_3$) different from the semiconductor layer or a homo-substrate such as GaN which is the same as the semiconductor layer. In addition, the support member 230 may be a SiC substrate which has higher thermal conductivity than the sapphire ($Al_2O_3$) substrate and is not limited thereto.

Although not shown, a buffer layer (not shown) may be arranged on the support member 230, to reduce lattice mismatch between the support member 230 and the first conductive semiconductor layer 242 and facilitate growth of the semiconductor layers.

The buffer layer (not shown) may have an AlInN/GaN laminate structure, an $In_xGa_{1-x}N$/GaN laminate structure or an $Al_xIn_yGa_{1-x-y}N/In_xGa_{1-x}N$/GaN laminate structure which includes AlN and GaN.

The light-emitting structure 240 is arranged on the support member 230 and the light-emitting structure 240 may include the first semiconductor layer 242, the active layer 244 and the second semiconductor layer 246.

For example, the first conductive semiconductor layer 242 may be an n-type semiconductor layer and the second conductive semiconductor layer 246 may be a p-type semiconductor layer, without being limited thereto. Meanwhile, respective n-type semiconductor layers and p-type semiconductor layers have been described above and a detailed explanation thereof is thus omitted.

An first electrode 252 may be formed on the first semiconductor layer 242, and a second electrode 254 may be formed on the second semiconductor layer 246.

Some regions of the first semiconductor layer 242 are exposed by removing some regions of the active layer 244 and the second semiconductor layer 246, and the first electrode 252 is formed on the upper surface of the first semiconductor layer 242 in the exposed region. That is, the first semiconductor layer 242 is provided with the upper surface facing the active layer 244 and the lower surface facing the support member 230, the upper surface of the first semiconductor layer 242 includes the exposed regions, and the first electrode 252 is disposed in the exposed regions of the upper surface of the first semiconductor layer 242.

Exposure of some regions of the first semiconductor layer 242 may be carried out using a specific etching method, but is not limited thereto. As the etching method, the wet etching method or the dry etching method may be used.

The first and second electrode 252 and 254 may be made of a conductive material, for example, one selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof, and be formed in a single layer or multi-layer structure. However, the formation of the first and second electrode 252 and 254 is not limited thereto.

Meanwhile, as shown in FIG. 6A, the support member 230 may be arranged on the luminescence layer 220, or, as shown in FIG. 6B, the support member 230 surrounds the luminescence layer 220, or, as shown in FIG. 6C, the support member 230 surrounds the luminescence layer 220 and the reflective layer 210, without being limited thereto.

The support member 230 surrounds the luminescence layer 220, the reflective layer 210, or the luminescence layer 220, to secure reliable connection between the support member 230, the luminescence layer 220 and the reflective layer 210.

As shown in FIGS. 6A and 6B, the light-emitting device 200 according to the embodiment may be a vertical light-emitting device, a horizontal light-emitting device or a flip chip, without being limited thereto.

FIGS. 7 to 14 are views illustrating a series of processes for manufacturing the light-emitting device according to one embodiment.

Figure 7:
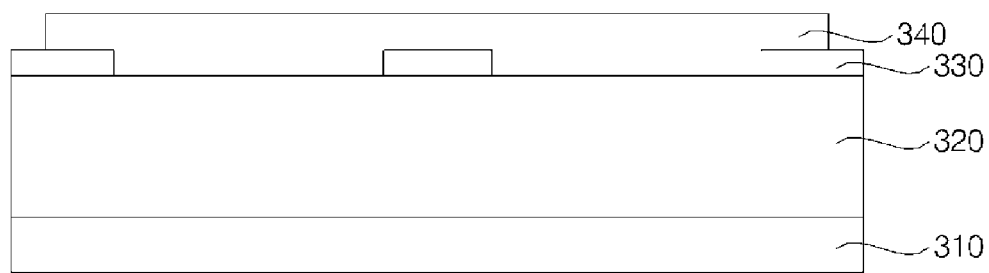
FIGS. 7 to 14 are views illustrating a series of processes for manufacturing the light-emitting device according to another embodiment.

First, as shown in FIG. 7, a light-emitting structure 320 provided with a first conductive semiconductor layer, an active layer and a second conductive semiconductor layer is formed on a first support member 310, and a current blocking layer 330 is formed on the light-emitting structure 320. The first support member 310 may be a sapphire substrate, but is not limited thereto. Then, a light-transmitting electrode layer 340 is formed on the light-emitting structure 320 provided with the current blocking layer 330. At this time, it is assumed that the light-emitting structure 320 emits blue light.

Figure 8:
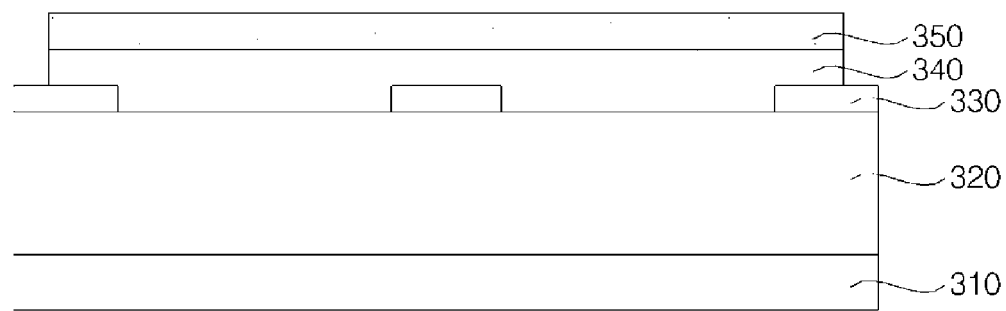

Then, as shown in FIG. 8, a luminescence layer 350 is formed on the light-transmitting electrode layer 340. The luminescence layer 350 has a thickness of 1 μm to 2 μm. Meanwhile, after the luminescence layer 350 is formed, it may be further subjected to a patterning process.

Figure 9:
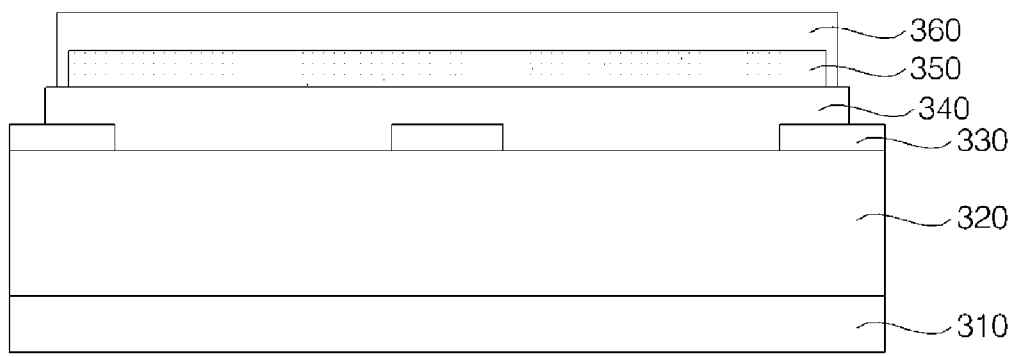
Figure 10:
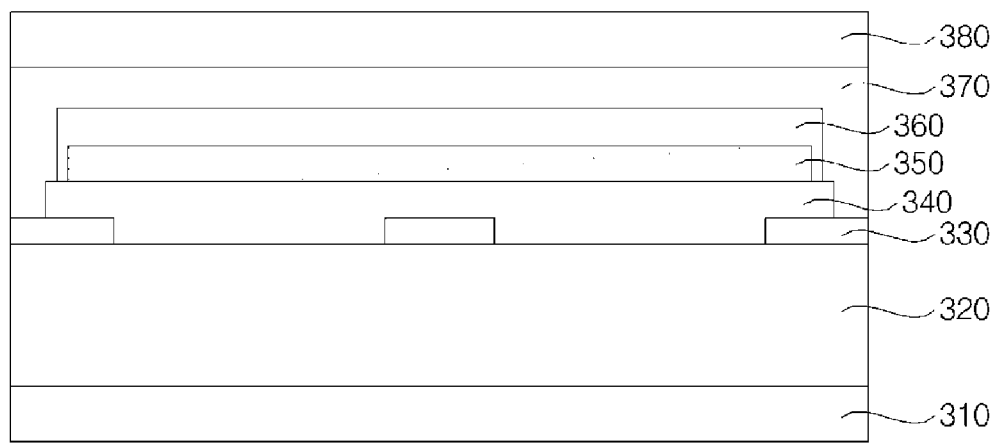

Then, as shown in FIG. 9, a reflective layer 360 is formed on the luminescence layer 350, and, as shown in FIG. 10, a diffusion barrier layer 370 and an adhesive layer 380 are sequentially formed thereon.

Figure 11:
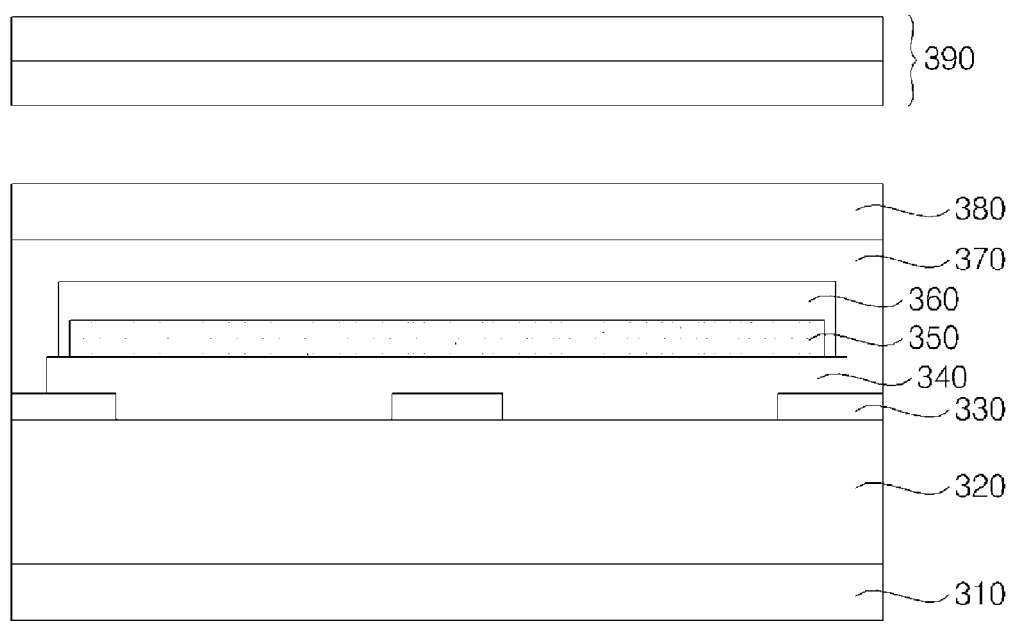

Then, as shown in FIG. 11, a second support member 390 is adhered to the adhesive layer 380. The process of FIG. 11 is a process for forming a sub-support member to replace the first support member 310, before the first support member 310 is removed.

Figure 12:
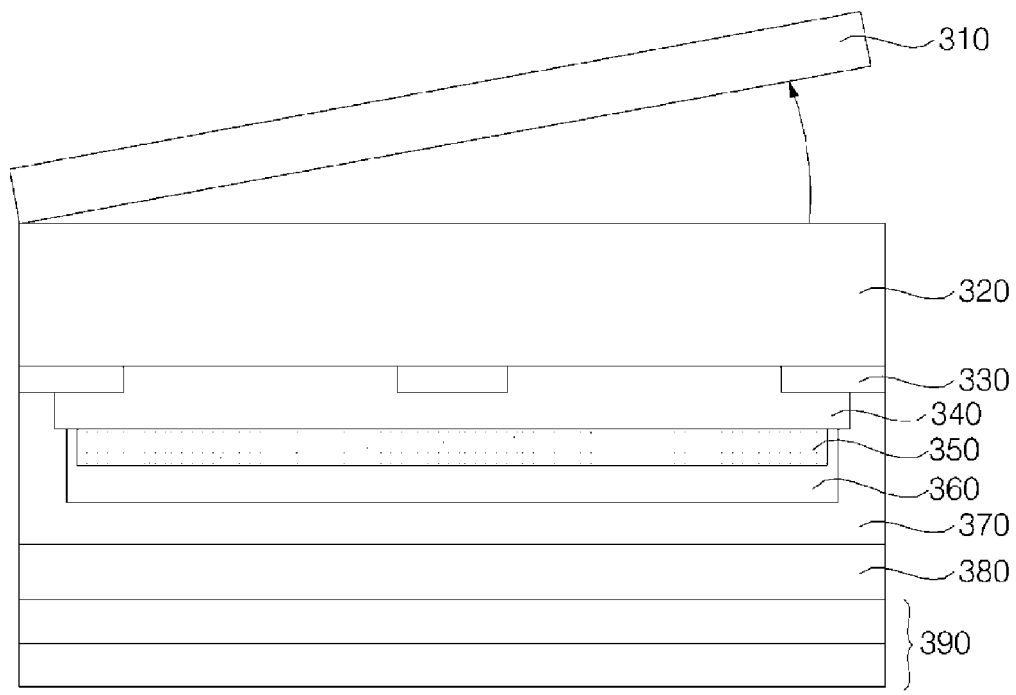
Figure 13:
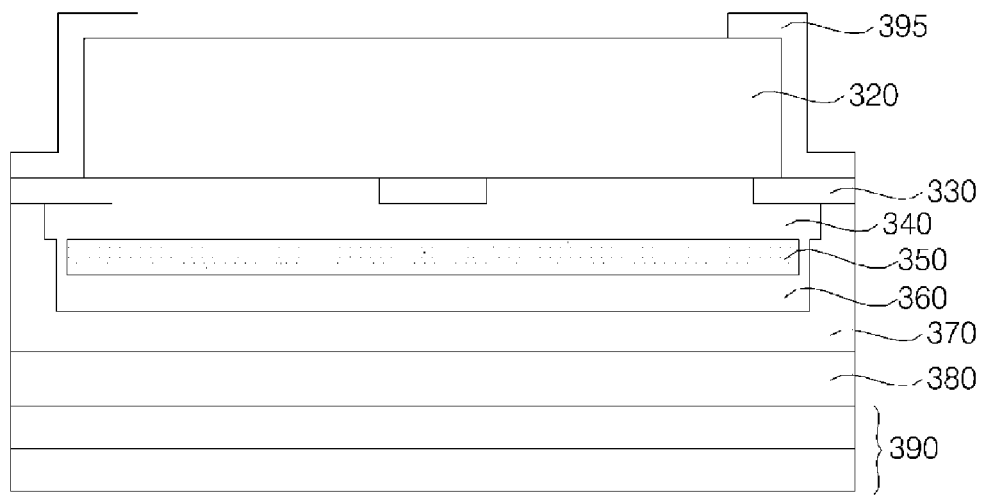

Then, as shown in FIG. 12, the first support member 310 is removed. The process of removing the first support member 310 may be an LLO process. The LLO process is carried out by irradiating a laser with a wavelength range of 300 nm to 400 nm to the boundary between the first support member 310 and the light-emitting structure 320, and separating the first support member 310 from the light-emitting structure 320. When the first support member 310 is removed by the LLO process illustrated in FIG. 12, the second support member 390 may replace the first support member 310, as shown in FIG. 13. Meanwhile, in order to protect an exposed region of the light-emitting structure 320, a passivation layer 395 is formed at both sides of the light-emitting structure through a passivation process.

Figure 14:
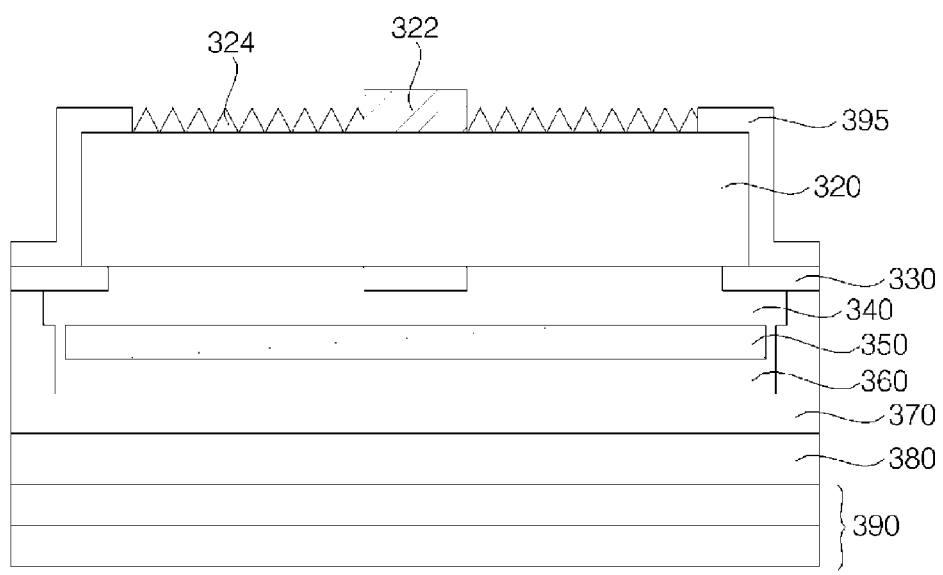

Finally, a light extraction structure 322 is formed on the light-emitting structure 320 illustrated in FIG. 14 and an electrode 324 is formed thereon. Meanwhile, as shown in FIG. 2, a light extraction structure 322 may be formed on a second light-transmitting electrode layer (not shown) provided on the surface of the light-emitting structure 320, but is not limited thereto.

Figure 15A:
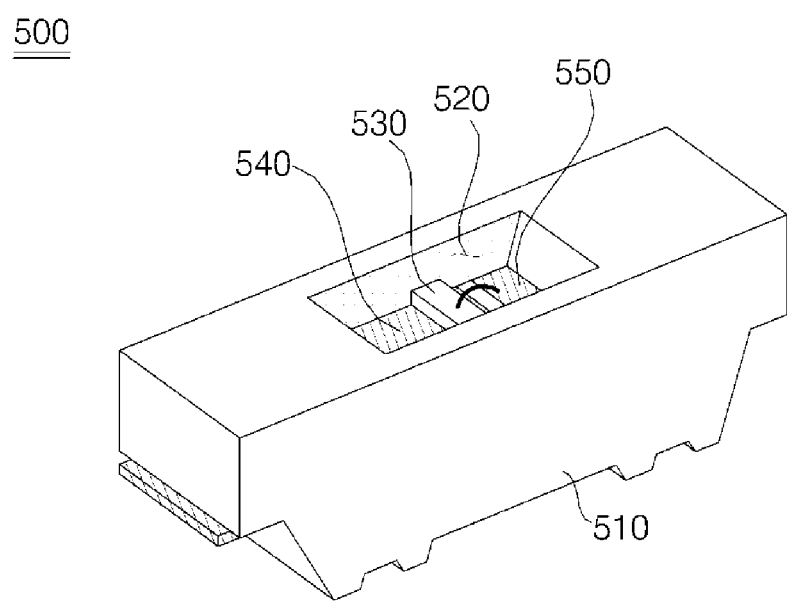
FIG. 15A is a perspective view illustrating a light-emitting device including the light-emitting device packages according to another embodiment.
Figure 15B:
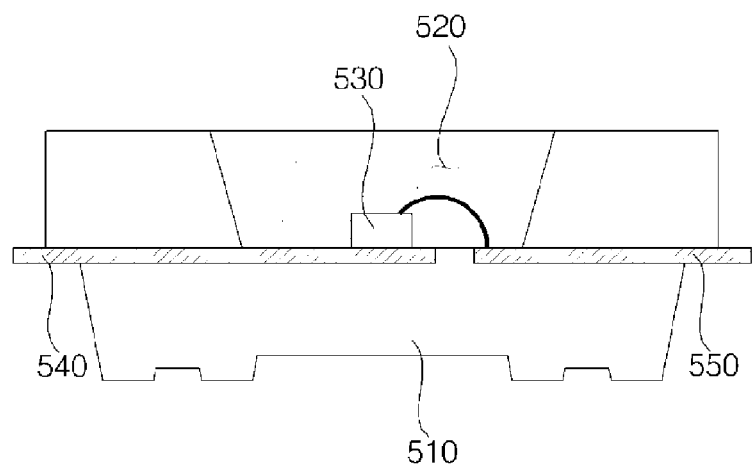
FIG. 15B is a sectional view illustrating a light-emitting device including the light-emitting device package according to another embodiment.
Figure 15C:
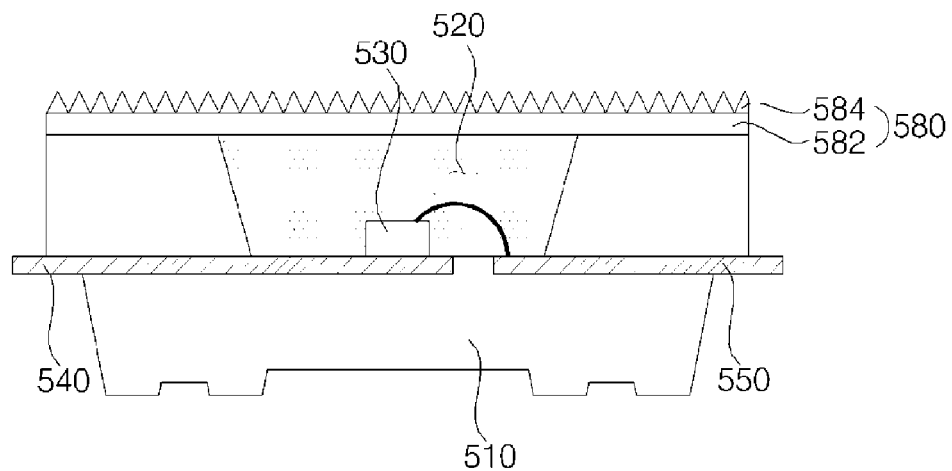
FIG. 15C is a sectional view illustrating a light-emitting device including the light-emitting device package according to another embodiment.

FIGS. 15A to 15C are a perspective view and a sectional view illustrating a light-emitting device package according to one embodiment.

Referring to FIGS. 15A to 15C, a light-emitting device package 500 includes a body 510 provided with a cavity 520, first and second lead frames 540 and 550 mounted on the body 510, a light-emitting device 530 electrically connected to the first and second lead frame 540 and 550, and a sealant (not shown) filling the cavity 520 to cover the light-emitting device 530.

The body 510 may be composed of at least one selected from resin materials such as polyphthalamide (PPA), silicon (Si), aluminum (Al), aluminum nitride (AlN), photo sensitive glass (PSG), polyamide9T (PA9T), syndiotactic polystyrene (SPS), metal materials, sapphire ($Al_2O_3$), beryllium oxide (BeO) and printed circuit boards (PCB). The body 510 may be formed by a process such as injection molding and etching, without being limited thereto.

The inner surface of the body 510 may be provided with an inclined surface. The reflective angle of light emitted from the light-emitting device 530 may be varied depending on the angle of the inclined surface. Accordingly, the orientation angle of light discharged outside can be controlled.

As the orientation angle of light decreases, convergence of light emitted from the light-emitting device 530 to the outside increases. On the other hand, as the orientation angle of light increases, convergence of light from the light-emitting device 530 to the outside decreases.

Meanwhile, as seen from the top, the cavity 520 provided in the body 510 may have various shapes including a circular shape, a rectangular shape, a polygonal shape, an oval shape and a shape with curved corners, although the present invention is not limited thereto.

The light-emitting device 530 may be electrically connected to the first and second lead frames 540 and 550 in a flip chip manner.

Meanwhile, the light-emitting device 530 according to this embodiment includes a reflective layer (not shown) to improve luminous efficiency.

The cavity 520 is filled with the sealant (not shown) such that the sealant covers the light-emitting device 530.

The sealant (not shown) may be composed of silicon, epoxy or other resin material and may be formed by filling the cavity 520 with a sealant material, followed by UV or heat curing.

In addition, the sealant (not shown) may include a phosphor, and the phosphor is selected from depending on the wavelength of light emitted from the light-emitting device 530 to allow the light-emitting device package to render white light.

Meanwhile, since the light-emitting device 530 according to one embodiment includes a luminescence layer (not shown) and a reflective layer (not shown), the phosphor may be not present in the sealant (not shown) and problems generated in the light-emitting device packaging process may be thus prevented.

The first and second lead frames 540 and 550 may include a metal material selected from titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and an alloy thereof. In addition, the first and second lead frames 540 and 550 may have a mono- or multi-layer structure, although the present invention is not limited thereto.

The first second lead frame 540 and 550 are spaced from each other and are electrically separated. The light-emitting device 530 is mounted on the first and second lead frames 540 and 550, and the first and second lead frames 540 and 550 directly contact the light-emitting device 530, or are electrically connected thereto through a conductive material such as soldering member (not shown). In addition, the light-emitting device 530 may be electrically connected to the first and second lead frames 540 and 550 via wire bonding, although the present invention is not limited thereto. Accordingly, when a power source is connected to the first and second lead frames 540 and 550, power may be supplied to the light-emitting device 530. Meanwhile, a plurality of lead frames (not shown) are mounted in the body 510 and respective lead frames (not shown) are electrically connected to the light-emitting device 530, although the present invention is not limited thereto.

Meanwhile, referring to FIG. 15C, the light-emitting device package 500 according to the embodiment may include an optical sheet 580 and the optical sheet 580 may include a base 582 and a prism pattern 584.

The base 582 is a supporter to form the prism pattern 584, which is composed of a transparent material exhibiting superior thermal stability. For example, such a transparent material may be selected from the group consisting of polyethylene terephthalate, polycarbonate, polypropylene, polyethylene, polystyrene and polyepoxy, but is not limited thereto.

In addition, the base 582 may include a phosphor (not shown). For example, the base 582 may be formed by homogenously dispersing a phosphor (not shown) in the material constituting the base 582, followed by curing. When the base 582 is formed according to this method, the phosphor (not shown) can be homogeneously dispersed throughout the base 582.

Meanwhile, a prism pattern 584 to refract and concentrate light may be arranged on the base 582. A material for the prism pattern 584 may be an acrylic resin, without being limited thereto.

The prism pattern 584 includes a plurality of linear prisms arranged in one direction on one surface of the base 582 such that the linear prisms are parallel to one another and the cross-section of the linear prisms taken along an axial direction may take the shape of a triangle.

The prism pattern 584 can concentrate light. For this reason, when the optical sheet 580 is adhered to the light-emitting device package 500 of FIG. 5, straightness of light can be improved and brightness of the light-emitting device package 500 can be thus enhanced.

Meanwhile, the prism pattern 584 may include a phosphor (not shown).

The phosphor (not shown) may be uniformly present in the prism pattern 584 by mixing the phosphor with an acrylic resin which forms the prism pattern 584 in a dispersed state to produce a paste or slurry and then forming the prism pattern 584.

In the case where the phosphor (not shown) is present in the prism pattern 584, light uniformity and distribution level of the light-emitting device package 500 are improved and the orientation angle of light-emitting device package 500 can be thus improved due to dispersion effect of light by the phosphor (not shown) as well as concentration effect of light by the prism pattern 584.

The light-emitting device package 500 according to one embodiment is arrayed in plural on the substrate and optical members such as the light guide plate, prism sheet and diffusion sheet may be arranged on a light passage of the light-emitting device package 500. The light-emitting device package, the substrate and the optical members may serve as a light unit. In another embodiment, a display device, an indicating device and a lighting device including the light-emitting device or light-emitting device packages disclosed in the afore-mentioned embodiments may be realized. For example, the lighting device may include a lamp, a streetlamp, or the like.

Figure 16A:
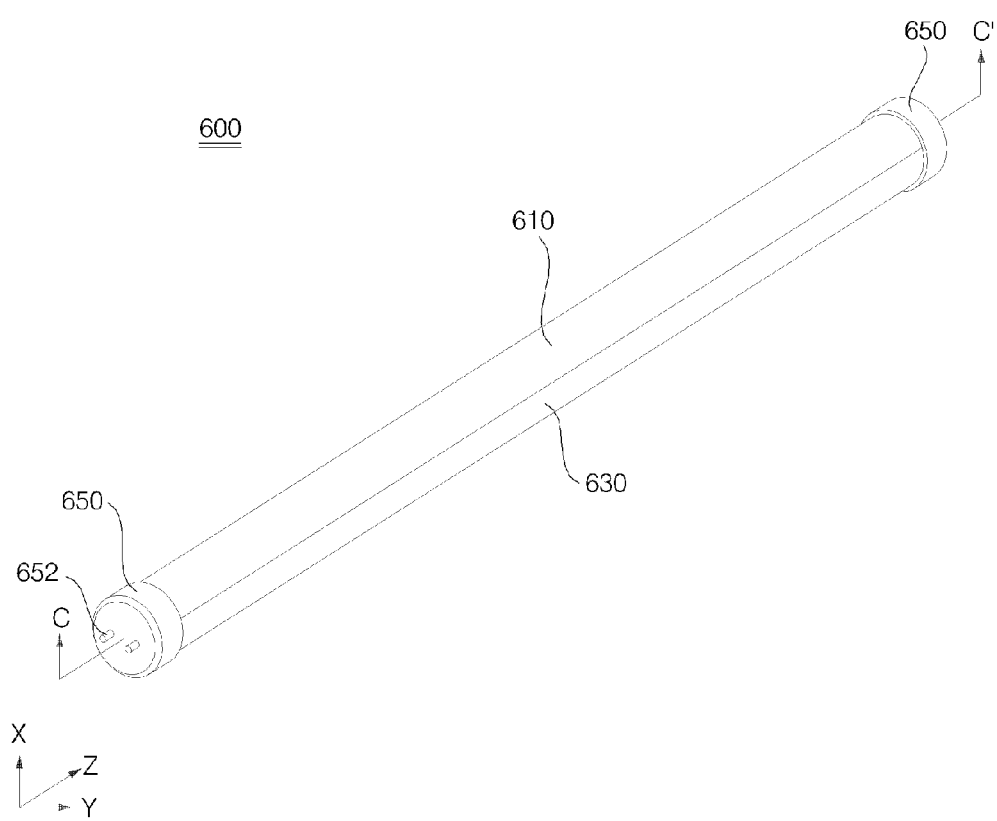
FIG. 16A is a perspective view illustrating a lighting device including the light-emitting device package according to another embodiment.
Figure 16B:
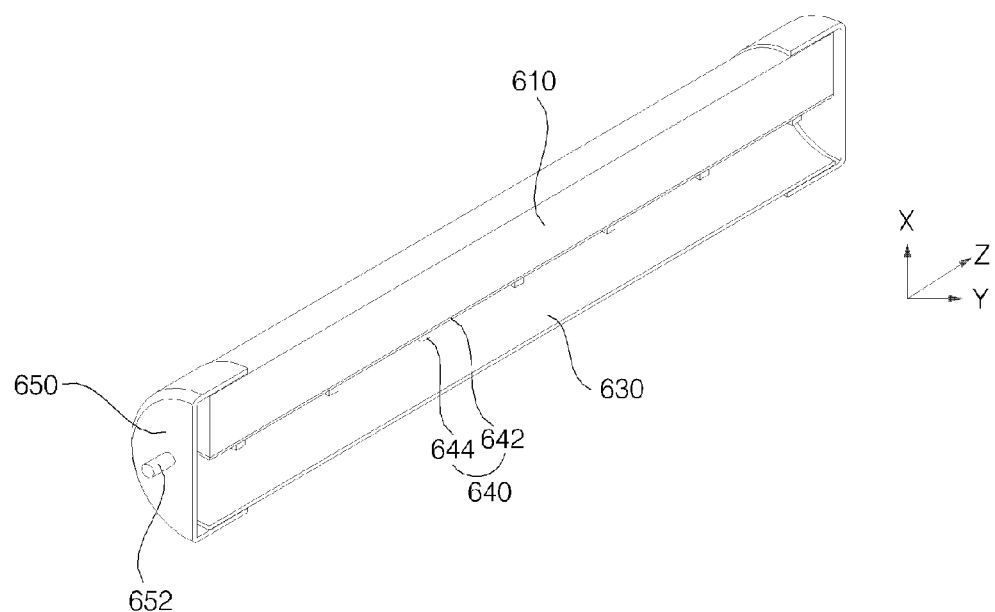
FIG. 16B is a sectional view illustrating a lighting device including the light-emitting device package according to another embodiment.

FIG. 16A is a perspective view illustrating a lighting device including the light-emitting device package according to one embodiment. FIG. 16B is a sectional view illustrating the cross-section taken along the line of C-C' of the lighting device of FIG. 16A.

Referring to FIGS. 16A and 16B, the lighting device 600 may include a body 610, a cover 630 connected to the body 610 and an end cap 650 arranged at both ends of the body 610.

A light-emitting device module 640 is connected to the bottom of the body 610 and the body 610 may be composed of a metal material which exhibits superior conductivity and heat release effect in order to discharge heat generated from the light-emitting device package 644 to the outside through the top of the body 610.

The light-emitting device packages 644 are mounted on the PCB 642 in multiple colors and multiple rows to constitute an array, and may be spaced from one another by a predetermined distance or by different distances, as necessary, to control brightness. The PCB 642 may be a metal core PCB (MPPCB) or PCB made of FR4.

In particular, each light-emitting device package 644 includes a light-emitting device (not shown), and the light-emitting device (not shown) includes a reflective layer (not shown) to improve light extraction efficiency and thereby improve luminous efficiency of the light-emitting device package and lighting device.

The light-emitting device package 644 includes an extended lead frame (not shown), thus improving light irradiation and thus enhance reliability and efficiency of the light-emitting device package 644, and lengthening the lifespan of the lighting device 600 including the light-emitting device package 622 and the light-emitting device package 644.

The cover 630 may take the shape of a circle to surround the bottom of the body 610, without being limited thereto.

The cover 630 protects the light-emitting device module 640 from foreign substances. In addition, the cover 630 prevents glare generated from the light-emitting device package 644 and includes diffusion particles to uniformly discharge light to the outside. In addition, a prism pattern or the like may be formed on at least one of the inner and outer surfaces of the cover 630. Alternatively, a phosphor may be applied onto at least one of the inner and outer surfaces of the cover 630.

Meanwhile, the cover 630 should exhibit superior light transmittance, so that it can discharge light generated from the light-emitting device package 644 through the cover 630 to the outside, and the cover 630 should exhibit sufficient heat resistance so that it can endure heat emitted by the light-emitting device package 644. Preferably, the cover 630 is composed of a material including polyethylene terephthalate (PET), polycarbonate (PC) or polymethyl methacrylate (PMMA) and the like.

The end cap 650 is arranged on both ends of the body 610 and may be used to seal a power device (not shown). In addition, the end cap 650 is provided with a power pin 652, allowing the lighting device 600 to be applied to a conventional terminal in which a fluorescent light is removed, without using any additional device.

Figure 17:
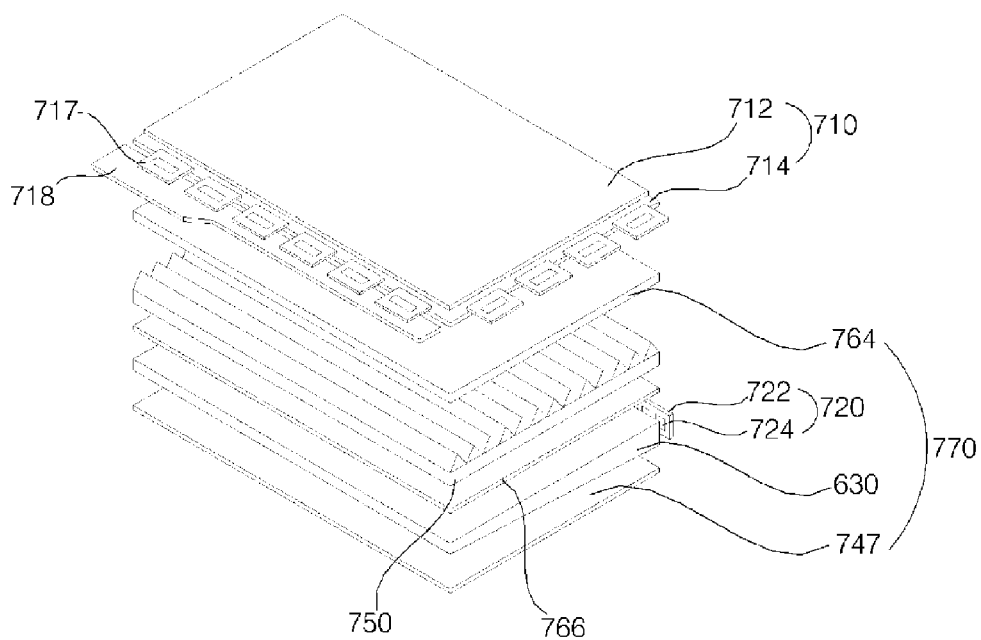
FIG. 17 is an exploded perspective view illustrating a liquid crystal display including the light-emitting device according to another embodiment.

FIG. 17 is an exploded perspective view illustrating a liquid crystal display including the light-emitting device according to one embodiment.

FIG. 17 illustrates an edge-light type liquid crystal display device 700 which includes a liquid crystal display panel 710 and a backlight unit 770 to supply light to the liquid crystal display panel 710.

The liquid crystal display panel 710 displays an image using light supplied from the backlight unit 770. The liquid crystal display panel 710 includes a color filter substrate 712 and a thin film transistor substrate 714 which face each other such that a liquid crystal is interposed therebetween.

The color filter substrate 712 can realize color of images to be displayed through the liquid crystal display panel 710.

The thin film transistor substrate 714 is electrically connected to a printed circuit board 718 on which a plurality of circuit components are mounted through a driving film 717. The thin film transistor substrate 714 responds to drive signals supplied from the printed circuit board 718 and may apply a drive voltage from the printed circuit board 718 to liquid crystals.

The thin film transistor substrate 714 includes a thin film transistor and a pixel electrode formed as a thin film on another substrate composed of a transparent material such as glass or plastic.

The backlight unit 770 includes a light-emitting device module 720, a light guide plate 730 to convert light emitted from the light-emitting device module 720 into a surface light source and supply the light to the liquid crystal display panel 710, a plurality of films 750, 766 and 764 to uniformize brightness of light from the light guide plate 730 and thus improve vertical incidence, and a reflective sheet 740 to reflect light emitted to the back of the light guide plate 730 to the light guide plate 730.

The light-emitting device module 720 includes a plurality of light-emitting device packages 724 and a PCB 722 on which the light-emitting device packages 724 are mounted to form an array.

In particular, the light-emitting device package 724 includes a light-emitting device (not shown) and the light-emitting device (not shown) includes a reflective layer (not shown) to improve light extraction efficiency and thereby luminous efficiency of the light-emitting device package 724 and the backlight unit 770.

Meanwhile, the backlight unit 770 includes a diffusion film 766 to diffuse light incident from the light guide plate 730 toward the liquid crystal display panel 710, a prism film 750 to concentrate the diffused light and thus improve vertical incidence and a protective film 764 to protect the prism film 750.

Figure 18:
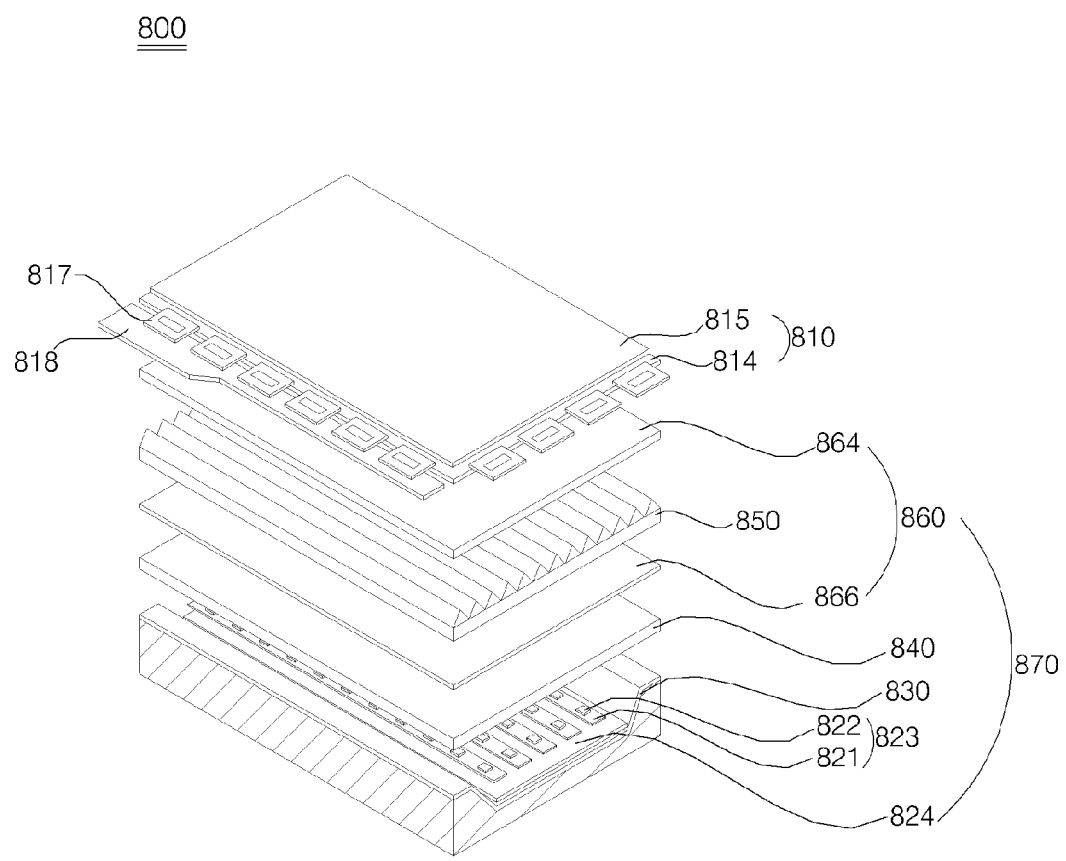
FIG. 18 is an exploded perspective view illustrating a liquid crystal display including the light-emitting device according to another embodiment.

FIG. 18 is an exploded perspective view illustrating a liquid crystal display including the light-emitting device according to one embodiment. The contents illustrated and described in FIG. 17 are not mentioned in detail.

FIG. 18 illustrates a direct-type liquid crystal display device 800 which includes a liquid crystal display panel 810 and a backlight unit 870 to supply light to the liquid crystal display panel 810.

The liquid crystal display panel 810 has been described in FIG. 7 and a detailed explanation thereof is omitted.

The backlight unit 870 includes a plurality of light-emitting device modules 823, a reflective sheet 824, a lower chassis 830 in which the light-emitting device modules 823 and the reflective sheet 824 are accepted, a diffusion plate 840 arranged on the light-emitting device modules 823, and a plurality of optical films 860.

Each light-emitting device module 823 includes a plurality of light-emitting device packages and a PCB 821 on which the light-emitting device packages 824 are mounted to form an array.

In particular, the light-emitting device package 822 includes a light-emitting device (not shown) and the light-emitting device (not shown) includes a reflective layer (not shown) to improve light extraction efficiency and thereby luminous efficiency of the light-emitting device packages 824 and the backlight unit 870.

The reflective sheet 824 reflects light generated from light-emitting device package 822 toward the liquid crystal display panel 810 to improve luminous efficacy.

Meanwhile, light emitted from the light-emitting device module 823 is incident on the diffusion plate 840 and an optical film 860 is arranged on the diffusion plate 840. The optical film 860 includes a diffusion film 866, a prism film 850 and a protective film 864.

Although the embodiments of the present invention have been disclosed for illustrative purposes, those skilled in the art will appreciate that various modifications, additions and substitutions are possible, without departing from the scope and spirit of the invention as disclosed in the accompanying claims. For example, the respective elements described in detail in the embodiments may be modified. Further, it will be understood that differences relating to these modifications, additions and substitutions are covered by the scope of the invention defined in the accompanying claims.

What is claimed is:

1. A light emitting device comprising:
    a reflective layer;
    a light emitting structure disposed on the reflective layer, the light emitting structure comprising a first conductive semiconductor layer, an active layer and a second conductive semiconductor layer;
    a luminescence layer disposed between the reflective layer and the light emitting structure;
    a light transmitting electrode layer disposed between the luminescence layer and the light emitting structure; and
    a current blocking layer disposed between the light transmitting electrode layer and the light emitting structure.

2. The light emitting device according to claim 1, wherein the luminescence layer formed a pattern structure includes pattern units spaced from one another by a predetermined distance of 0.1 µm to 1 µm.

3. A light emitting device comprising:
    a support member;
    a reflective layer disposed on the support member;
    a light emitting structure disposed on the reflective layer, the light emitting structure comprising a first conductive semiconductor layer, an active layer and a second conductive semiconductor layer;

a luminescence layer disposed between the reflective layer and the light emitting structure;

a light transmitting electrode layer disposed between the luminescence layer and the light emitting structure; and a current blocking layer disposed between the light transmitting electrode layer and the light emitting structure.

4. The light emitting device according to claim 3, further comprising:

a passivation layer disposed on both sides of the light emitting structure.

5. The light emitting device according to claim 3, further comprising:

a current blocking layer; and wherein the current blocking layer is disposed between the luminescence layer and the light-emitting structure.

6. The light emitting device according to claim 5, wherein the current blocking layer comprises at least one of silicon dioxide (SiO2) or aluminum oxide (Al2O3).

7. The light emitting device according to claim 3, wherein the reflective layer is composed of a reflective material selected from Ag, Ni, Al, Rh, Pd, Ir, Ru, Mg, Zn, Pt, Au, Hf and a combination thereof.

8. The light emitting device according to claim 3, wherein the luminescence layer is formed by coating phosphors, followed by sputtering, or nano-ink printing.

9. A light emitting device comprising:

a support member;

a reflective layer disposed on the support member;

a light emitting structure disposed on the reflective layer, the light emitting structure comprising a first conductive semiconductor layer, an active layer and a second conductive semiconductor layer;

a passivation layer disposed on both sides of the light emitting structure;

a luminescence layer disposed between the reflective layer and the light emitting structure;

a light transmitting electrode layer disposed between the luminescence layer and the light emitting structure; and a current blocking layer disposed between the light transmitting electrode layer and the light emitting structure, wherein a width of the luminescence layer is longer than a width of the light emitting structure.

10. The light emitting device according to claim 9, wherein the luminescence layer comprises at least one of yellow phosphors, YAG, TAG, sulfide, silicate, aluminate, nitride, carbide, nitridosililcate, borate, fluoride and phosphate phosphors, and R, G and B tri-color phosphors.

11. The light emitting device according to claim 9, wherein the luminescence layer has a thickness of 0.5 μm to 4 μm.

12. The light emitting device according to claim 9, wherein the luminescence layer has a thickness of 1 μm to 2 μm.

13. The light emitting device according to claim 9, wherein the reflective layer comprises at least one of metal and metal oxide.

14. The light emitting device according to claim 9, wherein the reflective layer is composed of a reflective material selected from Ag, Ni, Al, Rh, Pd, Ir, Ru, Mg, Zn, Pt, Au, Hf and a combination thereof.

15. The light emitting device according to claim 9, further comprising:

a current blocking layer is disposed between the light transmitting electrode layer and the light-emitting structure.

16. The light emitting device according to claim 15, wherein the current blocking layer comprises at least one of silicon dioxide (SiO2) or aluminum oxide (Al2O3).

* * * * *